United States Patent
Kräuter

(10) Patent No.: US 8,569,782 B2
(45) Date of Patent: Oct. 29, 2013

(54) OPTOELECTRONIC SEMICONDUCTOR COMPONENT

(75) Inventor: Gertrud Kräuter, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 89 days.

(21) Appl. No.: 13/318,624

(22) PCT Filed: May 12, 2010

(86) PCT No.: PCT/EP2010/056602
§ 371 (c)(1),
(2), (4) Date: Dec. 7, 2011

(87) PCT Pub. No.: WO2010/145893
PCT Pub. Date: Dec. 23, 2010

(65) Prior Publication Data
US 2012/0098015 A1    Apr. 26, 2012

(30) Foreign Application Priority Data
Jun. 17, 2009   (DE) .......................... 10 2009 025 266

(51) Int. Cl.
*H01L 33/00* (2010.01)
(52) U.S. Cl.
USPC ...................... 257/98; 257/294; 257/E31.121
(58) Field of Classification Search
USPC ..................................... 257/98, 294, E31.121
See application file for complete search history.

(56) References Cited

U.S. PATENT DOCUMENTS

| | | |
|---|---|---|
| 2004/0007169 A1 | 1/2004 | Ohtsu et al. |
| 2004/0144987 A1 | 7/2004 | Ouderkirk et al. |
| 2004/0238837 A1* | 12/2004 | Jacob et al. ................. 257/99 |
| 2007/0018102 A1 | 1/2007 | Braune et al. |
| 2008/0079015 A1 | 4/2008 | Krummacher |
| 2010/0084962 A1 | 4/2010 | Winkler et al. |

FOREIGN PATENT DOCUMENTS

| | | |
|---|---|---|
| DE | 101 12 542 | 10/2002 |
| DE | 10 2005 063 106 | 7/2007 |
| DE | 10 2006 051 746 | 4/2008 |
| DE | 10 2007 010 719 | 9/2008 |
| WO | 02/075819 | 9/2002 |
| WO | 2007/076842 | 7/2007 |
| WO | WO 2007076842 | * 7/2007 |

* cited by examiner

*Primary Examiner* — A. Sefer
*Assistant Examiner* — Farid Khan
(74) *Attorney, Agent, or Firm* — DLA Piper LLP (US)

(57) ABSTRACT

An optoelectronic semiconductor component includes a housing main body and at least one optoelectronic semiconductor chip mounted on the housing main body. In operation, the optoelectronic semiconductor chip emits primary radiation including an ultraviolet radiation fraction. The semiconductor component also includes a filter medium that absorbs the ultraviolet radiation fraction and is located at least in part between the semiconductor chip and the housing main body and/or between the semiconductor chip and an optical component.

16 Claims, 3 Drawing Sheets

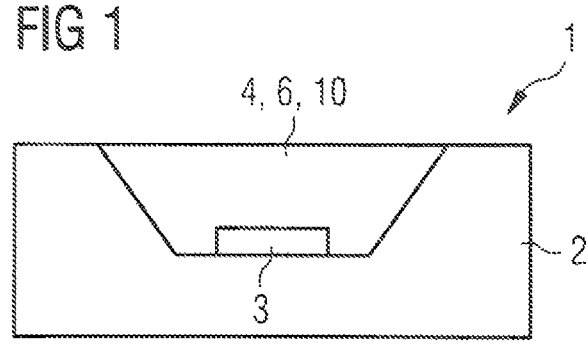
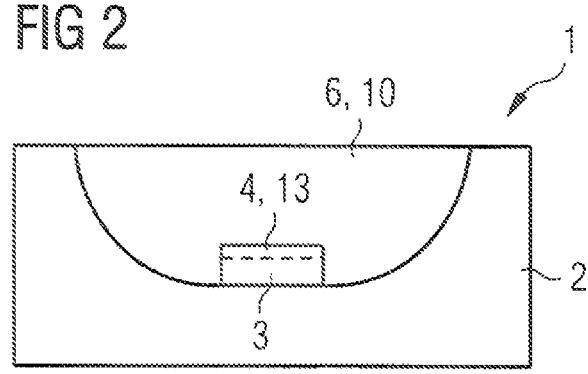
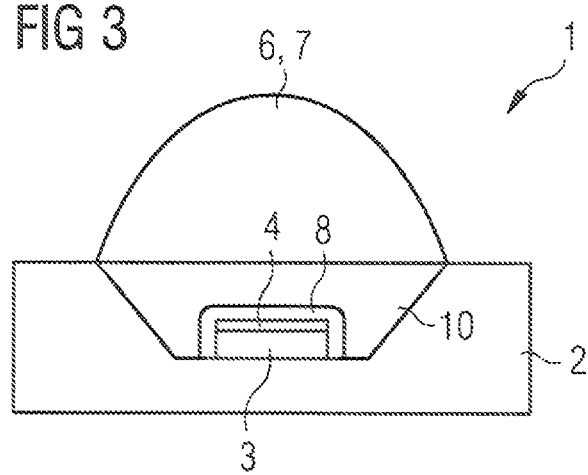

FIG 4
A)
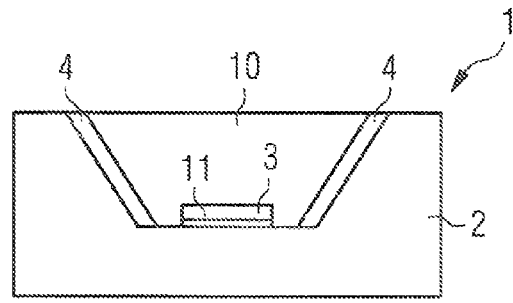
B)
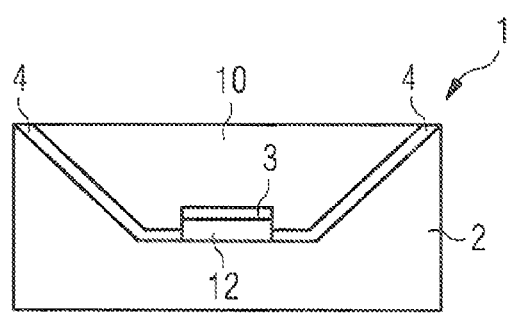
FIG 5
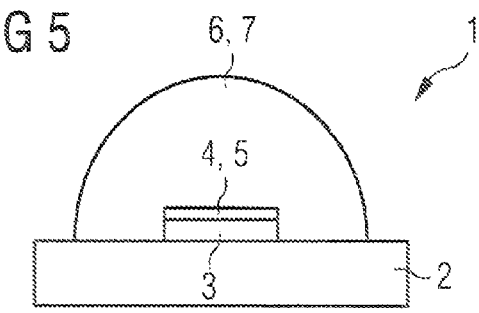
FIG 6
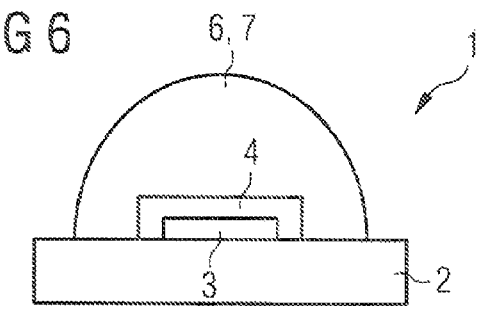

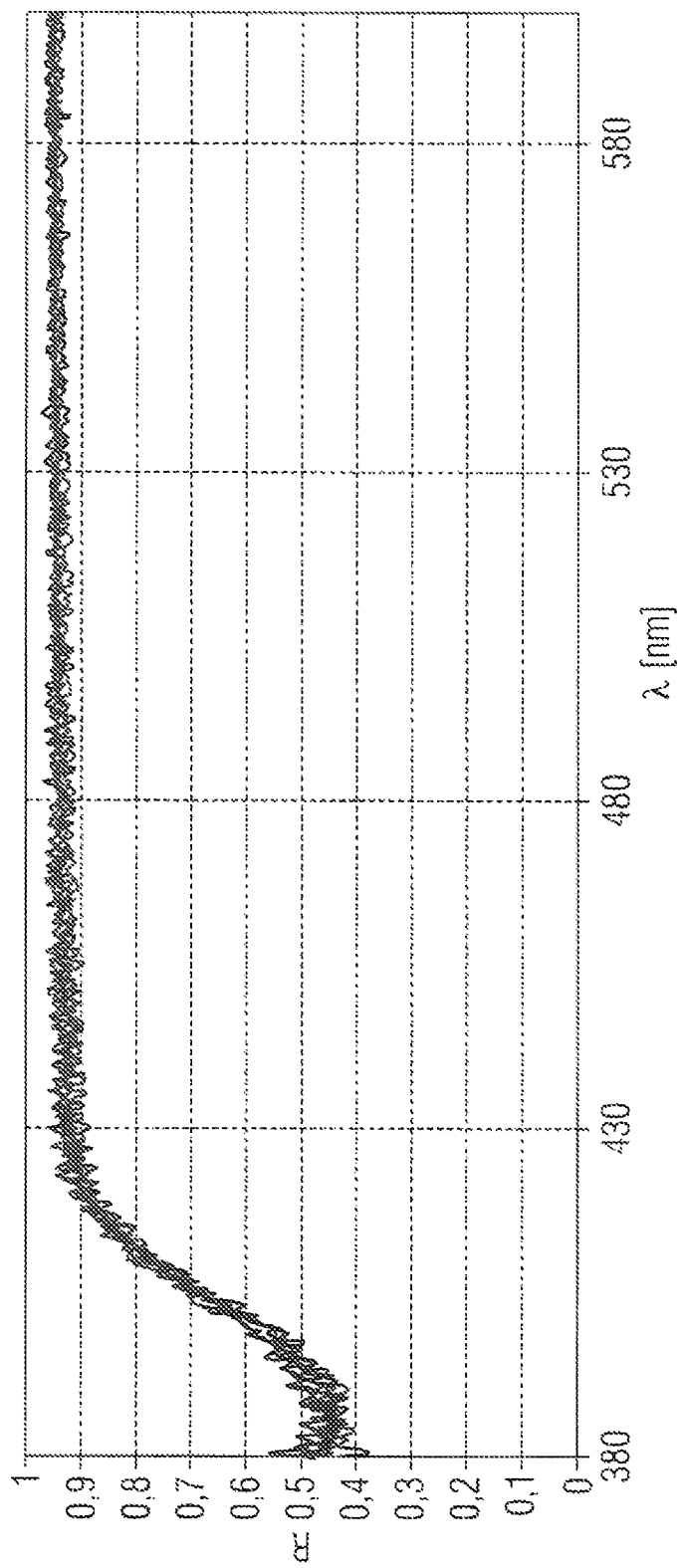

OPTOELECTRONIC SEMICONDUCTOR COMPONENT

RELATED APPLICATIONS

This is a §371 of International Application No. PCT/EP2010/056602, with an international filing date of May 12, 2010 (WO 2010/145893, published Dec. 23, 2010), which is based on German Patent Application No. 10 2009 025 266.5, filed Jun. 17, 2009, the subject matter of which is incorporated by reference.

TECHNICAL FIELD

This disclosure relates to an optoelectronic semiconductor component.

BACKGROUND

U.S. 2004/0238837 A1 relates to a radiation-emitting optical component. A light-emitting component with a luminescence conversion element is described in U.S. 2007/0018102 A1.

It could thus be helpful to provide an optoelectronic semiconductor component which is particularly resistant to ageing.

SUMMARY

I provide an optoelectronic semiconductor component including a housing main body, at least one optoelectronic semiconductor chip mounted on the housing main body that emits primary radiation, the primary radiation comprising an ultraviolet radiation fraction, and a filter medium which absorbs the ultraviolet radiation fraction of the primary radiation, the filter medium being located at least in part between the semiconductor chip and the housing main body or between the semiconductor chip and an optical component, and the ultraviolet radiation fraction constituting a proportion of the total optical power of the primary radiation of 0.1% to 4.0%.

BRIEF DESCRIPTION OF THE DRAWINGS

FIGS. 1 to 6 show schematic sectional representations of examples of optoelectronic semiconductor components described herein.

FIG. 7 shows a schematic representation of the dependency of the reflectance of titanium dioxide on wavelength.

DETAILED DESCRIPTION

The optoelectronic semiconductor component may comprise a housing main body. The housing main body is for example an injection molding of a plastics material, a resin or a silicone, which may be molded onto electrical lead frames. It is likewise possible for the housing main body to comprise or consist of a printed circuit board. The printed circuit board may comprise a ceramic carrier or a metal carrier, on and/or in which electrically insulating and/or electrically conductive coatings may be applied to form conductor tracks and/or connection points.

The optoelectronic semiconductor component may comprise at least one optoelectronic semiconductor chip mounted on the main body. The optoelectronic semiconductor chip is designed to emit primary radiation, the primary radiation containing an ultraviolet radiation fraction, or UV radiation fraction for short. The optoelectronic semiconductor chip is a light-emitting diode or a semiconductor laser chip, for example. The UV radiation fraction may exhibit wavelengths of 200 nm to 400 nm. In other words, ultraviolet radiation may mean that the radiation exhibits wavelengths of 200 nm to 400 nm.

The optoelectronic semiconductor component may comprise a filter medium designed to absorb the UV radiation fraction of the primary radiation, i.e. after passage through the filter medium the UV radiation fraction is attenuated by the filter medium by at least 50%, preferably at least 80%, particularly preferably at least 95%.

The filter medium may be located wholly or partially between the semiconductor chip and the housing main body. At least part of the UV radiation fraction of the primary radiation emitted by the semiconductor chip is thus prevented by the filter medium from reaching the housing main body.

The filter medium may be located partially or wholly between the semiconductor chip and an optical component. The optical component may be a lens and/or a reflector. It is possible for the optical component to be a constituent part of the semiconductor component itself.

The filter medium thus makes it possible for the UV radiation fraction which reaches the optical component to be reducible, in comparison with a semiconductor component without such a filter medium.

The UV radiation fraction may constitute a proportion of 0.1% to 4.0% of the total optical power of the primary radiation. Preferably, the UV radiation fraction, relative to the total optical power, is 0.2% to 3.0%, in particular 0.25% to 2.5% The remaining radiation fraction which, for example, only exhibits wavelengths greater than 400 nm, is preferably in the visible spectral range, i.e. the UV radiation fraction of the primary radiation emitted by the semiconductor chip constitutes only a small proportion of the total radiation.

The optoelectronic semiconductor component may comprise a housing main body and at least one optoelectronic semiconductor chip mounted on the housing main body. In operation, the optoelectronic semiconductor chip emits primary radiation, the primary radiation comprising a UV radiation fraction. Furthermore, the semiconductor component comprises a filter medium designed to absorb the UV radiation fraction of the primary radiation, the filter medium being located at least in part between the semiconductor chip and the housing main body and/or between the semiconductor chip and an optical component. The UV radiation fraction amounts, relative to the total optical power of the primary radiation, to 0.1% to 4.0%.

Exposure to shortwave radiation, i.e. in particular ultraviolet radiation with wavelengths of less than or equal to 400 nm, may lead to discoloration a housing main body, a potting body surrounding the semiconductor chip or of optical elements molded from plastics. Such discoloration, for example, lowers the reflectance of a housing main body and likewise reduces the efficiency with which light is coupled out of the semiconductor component. Such discoloration may be prevented or slowed down markedly by preventing ultraviolet radiation from reaching the housing main body, for instance, or the optical element. This may be achieved by the filter medium, which is preferably located in the vicinity of the semiconductor chip. In other words, the UV radiation fraction of the primary radiation is in particular absorbed or at least greatly reduced close to the chip such that the UV radiation fraction, for example, does not reach the housing main body. Since the UV radiation fraction is relatively small, the efficiency of the semiconductor component is not significantly impaired by the filter medium itself.

The filter medium may be deposited epitaxially in at least one layer on the semiconductor chip. The filter medium may thus consist of an epitaxially grown layer. The filter medium preferably comprises a different material composition from the semiconductor chip. For example, the filter medium then comprises one or more InGaN layers applied epitaxially to the semiconductor chip, which preferably exhibit an absorption edge at around 400 nm. The filter medium may be grown directly on a semiconductor material of the semiconductor chip or also be separated by an interlayer, for example, by an electrically conductive layer, from the semiconductor material of the semiconductor chip.

The filter medium may comprise a titanium oxide such as titanium dioxide and/or a zinc oxide or consists thereof. For example, a titanium oxide or a zinc oxide is embedded in a matrix material of the filter medium.

The filter medium may be applied to the semiconductor chip in the form of a layer. The layer of the filter medium is preferably completely or in places in direct contact with the semiconductor chip, for example, an entire exposed outer face of the semiconductor chip is covered by the filter medium. The semiconductor chip may be completely enclosed by the filter medium and the housing main body.

The filter medium may be sealed on a side remote from the semiconductor chip with a silicon-containing layer. For example, the filter medium may then have a rough or porous surface remote from the semiconductor chip which is susceptible to oxidation for example. The silicon-containing layer, for example, formed with a glass, a silicone or an epoxide-silicone hybrid material or consisting thereof protects the filter medium from environmental influences. The material of the layer is in particular different from the material of a potting body.

The filter medium may be in direct contact with the semiconductor chip, i.e. at least in places the filter medium is in direct physical contact with a semiconductor material of the semiconductor chip. The semiconductor material with which the filter medium is in direct contact is preferably grown epitaxially.

The filter medium may take the form of a lamina, also referred to as sheet or plate. The lamina is preferably mechanically self-supporting, i.e. on the length scale of an edge length of the semiconductor chip the lamina does not bend or does so only insignificantly. Preferably, the lamina comprises at least one luminescent material. The lamina may comprise a silicone or a silicone-epoxide as matrix material for filter particles of the filter medium and/or for luminescent material particles.

The filter medium may be located between a material in which the luminescent material is embedded and the semiconductor chip. The material with the luminescent material may be in direct contact with the medium and the filter medium may be in direct contact with the semiconductor chip.

The lamina with the filter particles may be mounted on the semiconductor chip and is then preferably in direct contact therewith. For example, the lamina completely covers an upper side of the semiconductor chip remote from the housing main body. A bonding agent may be located between the lamina and the semiconductor chip. The lamina preferably exhibits a thickness of 5 µm to 100 µm, in particular of 10 µm to 60 µm.

The filter medium may be added to a potting body, the potting body partially or completely surrounding the semiconductor chip. In particular, the semiconductor chip is fully enclosed by the housing main body and the potting body. For example, the potting body fills a recess in the housing main body in which the semiconductor chip is mounted. The filter medium is preferably distributed homogeneously in the potting body. It is likewise also possible for the filter medium to be nonhomogeneously distributed in the potting body. The potting body may take the form of an optical component. The material of the potting body is, for example, a silicone, an epoxide and/or a plastics.

The filter medium may comprise or consist of nanoparticles. The nanoparticles preferably exhibit an average diameter of 0.5 nm to 100 nm. The nanoparticles are for example configured as indicated in U.S. 2004/0007169 A1, the subject matter, relating to the nanoparticles be incorporated herein by reference.

The filter medium may be applied to at least one boundary face of the housing main body and/or an optical component, which may be a constituent part of the semiconductor component. The filter medium may thus be present as a layer with a thickness of preferably at most 50 µm on at least one side of the housing main body and/or at least one side of the optical component.

The optical component may be in places in direct contact with the housing main body and/or with the filter medium, i.e. a material of the housing main body may be in direct contact with a material of the optical component.

The housing main body may be made from transparent or white plastics. In the case of the material of the housing main body, ultraviolet radiation, i.e. in particular radiation with wavelengths of 200 nm to 400 nm, may cause photodamage. Exposure to ultraviolet radiation may thus result in discoloration, for example, yellowing of the housing main body. Use of the filter medium makes the use of such materials for the housing main body possible, thereby reducing manufacturing costs.

In particular, use of the filter medium may make possible the use of high-temperature-resistant materials for the housing main body. High-temperature-resistant here preferably means that the housing main body withstands the temperatures of, for example, at least 245° C. arising during soldering for a period of at least 10 s without being destroyed. Such materials are, for example, polyamides, in particular polyphthalamide or PPA, or polyamides provided with fillers and/or stabilizers which display only comparatively low stability relative to ultraviolet or blue radiation. Use of the filter medium may also allow the cost-increasing fillers which delay the occurrence of photodamage to be dispensed with, at least in part.

The filter medium may take the form of a film, also referred to as foil. The film thickness of the film preferably amounts to 10 µm to 100 µm, in particular to 25 µm to 75 µm. The fact that the filter medium is a film may mean that the filter medium is mechanically flexible. In other words, the filter medium may be bendable on the length scale corresponding to an edge length for example of the optoelectronic semiconductor chip. It is possible for the filter medium in the form of a film not to be mechanically self-supporting.

The filter medium may comprise a scattering medium, wherein the scattering medium is preferably transparent or reflective for visible radiation. The scattering medium is preferably particulate in form and introduced into the matrix material of the filter medium.

The filter medium is transmissive, in particular, transparent to visible light. In other words, the filter medium does not impair visible radiation, in contrast with ultraviolet radiation, or does not do so significantly.

A semiconductor component described herein will be explained in greater detail below with reference to the drawings and with the aid of examples. Elements which are the same in the individual figures are indicated with the same reference numerals. The relationships between the elements are not shown to scale, however, but rather individual elements may be shown exaggeratedly large to assist in understanding.

FIG. 1 shows an example of an optoelectronic semiconductor component 1. A housing main body 2 formed, for example, by a reflective, white, injection-molded plastics material comprises a recess 10. An optoelectronic semiconductor chip 3, for example, a light-emitting diode, is mounted in the recess 10. To simplify the illustration, electrical contacts or lead frames to which the semiconductor chip 3 is mounted are not shown.

The recess 10 in the housing main body 2 is preferably filled completely with a potting body 6 such that the semiconductor chip 3 is completely surrounded by the potting body 6 and the housing main body 2. The filter medium 4, which may be present in the form of filter particles, is preferably homogeneously admixed with the potting body 6. The filter medium 4 absorbs an ultraviolet radiation fraction, UV radiation fraction, of primary radiation emitted by the semiconductor chip 3. This prevents the UV radiation fraction of the primary radiation from reaching the housing main body 2, or at least the UV radiation fraction of the primary radiation which does reach the housing main body 2 is reduced considerably. In this way, for example, discoloration of the plastics of the housing main body 2 is prevented or retarded. The UV radiation fraction here constitutes only a small proportion of the total radiation emitted by the semiconductor chip 3. In particular, a visible radiation fraction emitted by the semiconductor chip 3 may preferably pass unaffected or substantially unaffected through the potting body 6 with the filter medium 4.

In the example according to FIG. 2, the filter medium 4 takes the form of an epitaxial layer 13. The filter medium 4 may be formed in one piece with the semiconductor chip 3, indicated by a dashed line in FIG. 2. In one piece may mean that the filter medium 4 is firmly joined mechanically and without any bonding agent to the semiconductor chip 3. For example, the filter medium 4 is in direct contact with an epitaxially grown semiconductor material of the semiconductor chip 3.

Also according to FIG. 2, the semiconductor chip 3 with the filter medium 4 is located in the recess 10 in the housing main body 2. In contrast to FIG. 1 in which in sectional representation lateral boundary faces of the recess 10 are straight portions, according to FIG. 2, the lateral boundary faces of the recess 10 are curved. The lateral boundary faces of the recess 10 may act as a reflector, which reflects the radiation emitted by the semiconductor chip 3 in a targeted manner.

FIG. 3 shows that the filter medium 4 is situated on the semiconductor chip 3 in the form of a layer. The filter medium 4 preferably comprises titanium dioxide or consists thereof. For example, the filter medium 4 is produced by sputtering or by vapor deposition. In addition, the filter medium 4 and the semiconductor chip 3 are encapsulated by a silicon-containing layer 8. The silicon-containing layer 8, for example, silicon dioxide, silicon nitride, a silicone or a glass, may suppress the photoreactivity of the filter medium 4, i.e. in particular of titanium dioxide. The potting body 6 projecting over the recess 10 forms an optical component, for example, in the form of a convergent lens. At variance with what is shown in FIG. 3, the optical component 7 may also take the form of a Fresnel lens.

In the example according to FIG. 4A, a mirror 11 is located between the housing main body 2 and the semiconductor chip 3, which mirror has a reflective action with regard to the primary radiation emitted by the semiconductor chip 3. Lateral boundary faces of the recess 10 are covered by the filter medium 4 which is applied as a layer to the lateral boundary faces. The layer is, for example, printed on or applied by vapor deposition or sputtering. Preferably the filter medium 4 here has a reflective action with regard to the fraction of the primary radiation emitted by the semiconductor chip 3 with wavelengths in the visible spectral range.

In FIG. 4A, a bottom face of the recess 10 on which the semiconductor chip 3 and the mirror 11 are mounted, is not or substantially not covered by the filter medium 4, at variance with the example according to FIG. 4B. According to FIG. 4B, the semiconductor chip 3 is additionally at a comparatively large distance from the bottom face of the recess 10. Between the semiconductor chip 3 and the bottom face of the recess 10 there is located an intermediate support 12 which, for example, takes the form of a connection platform. This configuration particularly efficiently prevents a UV radiation fraction of the primary radiation from reaching the housing main body 2.

According to FIG. 5, the housing main body 2 is formed by a printed circuit board with conductor tracks, not shown, on which the semiconductor chip 3 is applied. The filter medium 4 is formed by a preferably mechanically self-supporting lamina 5 which exhibits a thickness of, for example, 10 μm to 100 μm. The filter medium 4 prevents the UV radiation fraction of the primary radiation from reaching the potting body 6, configured as an optical component 7 which, together with the planar housing main body 2, completely surrounds the semiconductor chip 3.

As an alternative to the configuration of the filter medium 4 as a mechanically self-supporting lamina 5, the filter medium 4 may unlike, for example, what is shown in FIGS. 3 to 5, take the form of a mechanically flexible film. It is likewise possible for the filter medium to be applied in the form of a silicone paste to which is admixed in particular a titanium oxide or a zinc oxide, on the semiconductor chip or indeed on boundary faces of the recess 10 or of the housing main body 2. The paste may then in particular be thermally cured.

In the example according to FIG. 6, the filter medium 4, together with the housing main body 2, completely surrounds the semiconductor chip 3. A mirror 11, not shown in FIG. 6, may optionally be located between the semiconductor chip 3 and the housing main body 2.

At variance with FIG. 6, the filter medium 4 may also surround the semiconductor chip 3 in the form of a lens. Such forms arise, for example, through application of the filter medium 4 by a droplet process. A matrix material of the filter medium 4 may, for example, be matched to a material of the potting body 6 such that these materials display good adhesion to one another.

FIG. 7 shows the profile of a reflectivity R as a function of a wavelength λ for titanium dioxide. Below around 400 nm the reflectivity of the titanium dioxide falls significantly. In the case in particular of multiple reflections, for example, if the filter medium 4 comprises a plurality of filter particles at which the primary radiation is repeatedly reflected, a UV radiation fraction with wavelengths below 400 nm may be effectively filtered out of the primary radiation by such a filter medium 4. The non-reflected UV radiation fraction is absorbed in particular by the titanium dioxide.

It is possible to use the filter particles of the filter medium at the same time as scattering particles. A luminescent material, for example, based on yttrium-aluminium-garnet:cerium may be admixed with the potting body and/or the filter medium, which luminescent material is designed to convert a blue radiation fraction of the primary, radiation in part or completely into longer-wave radiation.

For example, the semiconductor chip 3 exhibits maximum radiation emission at a wavelength of around 444 nm, total optical power amounting to around 0.4105 W and the radiant power below 400 nm being at most 0.0064 W, ultraviolet radiation consequently constituting around 1.6% of the total optical power. At a wavelength of around 450 nm the total optical power may amount to around 0.3902 W and the UV fraction to around 0.0047 W, while at a wavelength of around 457 nm and a total optical power of around 0.3956 W the optical power for example in UV is around 0.0025 W, and at a wavelength of around 465 nm and a total optical power of around 0.3353 W it is around 0.0013 W in the ultraviolet spectral range.

The components described herein are not limited by the description provided with reference to the examples, rather this disclosure encompasses any novel feature and any combination of features, including in particular any combination of features in the appended claims, even if the feature or the combination is not itself explicitly indicated in the claims or examples.

This patent application claims priority from German patent application 10 2009 025 266.5, whose disclosure content is hereby included by reference.

The invention claimed is:

1. An optoelectronic semiconductor component comprising:
    a housing main body,
    at least one optoelectronic semiconductor chip mounted on the housing main body that emits primary radiation, the primary radiation comprising an ultraviolet radiation fraction, and
    a filter medium which absorbs the ultraviolet radiation fraction of the primary radiation, the filter medium being located at least in part between the semiconductor chip and the housing main body or between the semiconductor chip and an optical component, and the ultraviolet radiation fraction constituting a proportion of the total optical power of the primary radiation of 0.1% to 4.0%.

2. The optoelectronic semiconductor component according to claim 1, wherein the ultraviolet radiation fraction is in the spectral range of 200 nm to 400 nm.

3. The optoelectronic semiconductor component according to claim 1, wherein the filter medium is deposited epitaxially on the semiconductor chip in at least one layer.

4. The optoelectronic semiconductor component according to claim 3, wherein the filter medium comprises InGaN.

5. The optoelectronic semiconductor component according to claim 1, wherein the filter medium comprises or consists of a titanium oxide and/or a zinc oxide.

6. The optoelectronic semiconductor component according to claim 1, wherein the filter medium consists of a titanium oxide and/or a zinc oxide and is mounted as a layer on the semiconductor chip, the filter medium being sealed on a side remote from the semiconductor chip by a silicon-containing layer.

7. The optoelectronic semiconductor component according to claim 1, wherein the filter medium is in direct contact with the semiconductor chip.

8. The optoelectronic semiconductor component according to claim 1, wherein the filter medium is formed by silicone lamina or a silicone-epoxide lamina containing a luminescent material to which lamina filter particles are added, the lamina being mounted on the semiconductor chip.

9. The optoelectronic semiconductor component according to claim 8, wherein the lamina has a thickness of 5 μm to 100 μm.

10. The optoelectronic semiconductor component according to claim 1, wherein the filter medium is added to a potting body which partially or completely surrounds the semiconductor chip.

11. The optoelectronic semiconductor component according to claim 1, wherein the filter medium comprises or consists of nanoparticles having an average diameter of 0.5 nm to 100 nm.

12. The optoelectronic semiconductor component according to claim 1, wherein the filter medium is applied to at least one boundary face of the housing main body and/or the optical component, the optical component being in places in direct contact with the housing main body and/or with the filter medium.

13. The optoelectronic semiconductor component according to claim 1, wherein the housing main body is molded from a transparent or white plastics material in which photodamage may be caused by ultraviolet radiation.

14. The optoelectronic semiconductor component according to claim 1, wherein the filter medium is a film.

15. The optoelectronic semiconductor component according to claim 1, wherein the filter medium comprises a scattering medium which is transparent or has a reflective action with regard to visible radiation.

16. An optoelectronic semiconductor component comprising:
    a housing main body,
    at least one optoelectronic semiconductor chip mounted on the housing main body and emits primary radiation, the primary radiation comprising an ultraviolet radiation fraction, and
    a filter medium that absorbs the ultraviolet radiation fraction of the primary radiation, and is located at least in part between the semiconductor chip and the housing main body or between the semiconductor chip and an optical component, the ultraviolet radiation fraction constituting a proportion of the total optical power of the primary radiation of 0.1% to 4.0%, wherein the filter medium is deposited epitaxially on the semiconductor chip in at least one layer, and the filter medium is in direct contact with the semiconductor chip.

* * * * *